United States Patent [19]

Laude

[11] Patent Number: 5,599,592
[45] Date of Patent: Feb. 4, 1997

[54] PROCESS FOR THE METALLIZATION OF PLASTIC MATERIALS AND PRODUCTS THERETO OBTAINED

[76] Inventor: Lucien D. Laude, res de Lilas 64, 59330 Hautmont, France

[21] Appl. No.: 530,315

[22] PCT Filed: Jan. 31, 1995

[86] PCT No.: PCT/EP95/00346

§ 371 Date: Sep. 29, 1995

§ 102(e) Date: Sep. 29, 1995

[87] PCT Pub. No.: WO95/20689

PCT Pub. Date: Aug. 3, 1995

[30] Foreign Application Priority Data

Jan. 31, 1994 [BE] Belgium ............................... 9400105

[51] Int. Cl.⁶ ........................................... B05D 3/06
[52] U.S. Cl. .................. 427/543; 427/555; 427/559; 427/591; 427/595; 427/98; 427/123; 427/259; 427/264; 427/266; 427/272; 427/275; 427/282; 427/306; 427/376.7; 427/383.5; 427/443.1; 216/65
[58] Field of Search ........................ 427/543, 553, 427/554, 555, 557, 559, 591, 595, 98, 123, 258, 259, 261, 264, 265, 266, 282, 304, 305, 306, 443.1, 269, 270, 271, 272, 275, 376.7, 383.5; 216/65

[56] References Cited

U.S. PATENT DOCUMENTS

| | | | |
|---|---|---|---|
| 4,440,801 | 4/1984 | Aviram et al. | 427/54.1 |
| 4,615,907 | 10/1986 | Boeke et al. | 427/53.1 |
| 4,639,378 | 1/1987 | Inoue | 427/35 |
| 4,746,536 | 5/1988 | Ichikawa et al. | 427/54.1 |
| 5,409,741 | 4/1995 | Laude | 427/555 |

FOREIGN PATENT DOCUMENTS

| | | |
|---|---|---|
| 182379 | 5/1986 | European Pat. Off. . |
| 272420 | 6/1988 | European Pat. Off. . |
| 501095 | 9/1992 | European Pat. Off. . |
| 634502 | 1/1995 | European Pat. Off. . |
| 63-186877 | 8/1988 | Japan . |

OTHER PUBLICATIONS

"Selective Metallization of Alumina By Laser", Shrivastva et al, Surface and Coatings Technology, vol. 46, No. 1, May, 1991, pp. 131–138.

"Excimer Laser Modification of Materials Surfaces", Pedraza, Int. Conf. Beam Process. Adv. Mater, Proc. Symp, Mater. Week, '92, Nov. 1992.

"Laser Activation and Metallisation of Oxide Ceramics", Shafeev, Advanced Materials For Optics and Electronics, vol. 2, No. 4, 1993, pp. 183–189.

*Primary Examiner*—Shrive P. Beck
*Assistant Examiner*—Erma Cameron
*Attorney, Agent, or Firm*—Stroock & Stroock & Lavan

[57] ABSTRACT

A positive metallization process for metallizing a plastic composite piece containing a polymer and grains of one or more oxides, includes three successive steps. The first step consists of irradiating the plastic piece surface to be metallized with a light beam emitted by an excimer laser. The second step consists of immersing the irradiated piece into at least one autocatalytic bath containing metal ions and without palladium. This immersion induces the deposit of the metal ions onto the irradiated surface to form a metal film onto the surface. The third step consists of thermally processing the metallized plastic piece to induce the diffusion of the deposited metal into the plastic piece.

16 Claims, No Drawings

PROCESS FOR THE METALLIZATION OF PLASTIC MATERIALS AND PRODUCTS THERETO OBTAINED

The present invention relates to a three-step metallization process which allows to produce a metal film which is strongly adhering onto the surface of a previously manufactured plastic piece.

Plastic materials may, under various forms, be used for a variety of functions in all industrial domains. Their amorphous molecular structure is responsible for their important electrical insulation proper with large scale electrical applications, as substrate to active systems or in packaging. Another remarkable advantage of such materials resides in their simplicity of utilization via molding or lamination. In contrast, the most crucial disadvantage of plastics is their morphogical fragility with a relatively very low melting temperature (typically, 220° C.) which limits their utilization and makes them largely uncompatible with other ordinary materials like metals and ceramics. Improving this compatibility has required a permanent development activity which particularly yielded so-called "thermoplastics" which may endure 300° C. or more. Other plastics with improved mechanical strength have been also developped.

These intrinsic characteristics depend on the various (mineral and/or organic) components which are added to the base material (e.g. polycarbonate, polyamide or other industrial polymers). However, a major difficulty persists in this development procedure which concerns metallization, i.e. interfacing a plastic piece with a metal.

Bringing selectively the metal to the areas of the plastic surface to be metallized can be performed via two so-called "positive" techniques: serigraphy and evaporation. Serigraphy is a six-step, low resolution (>100 µm) process. Being performed under vacuum, evaporation (through a mask) is ill-adapted to mass production. For these two processes, adhesion of the so-produced metal film on the plastic substrate is unsufficient (<0.1 MPa) for most applications.

In order to improve significantly such adhesion, it is possible to act, before metallization, on the texture or on the chemical composition of the plastic surface. Modifying the texture can be achieved mechanically by increasing rugosity and, consequently, the effective metal/plastic contact surface. This is a commonly used technique the products of which remain very unperfect (lack of homogeneity, poor reproducibility, no metal confinement possible). Modifying the superficial texture may also result from non-organic matters which are incorporated in the plastic (e.g. glass fiber), with no guarantee that adhesion of the metal on such a plastic would be effectively improved.

The superficial texture of the plastic may also be modified chemically. As an example, this may be achieved by using a metalorganic compound along the following steps:

the compound is dissolved in a specific solvent to form a solution;

the virgin plastic surface is impregnated with the solution;

after evaporating the solvent, the compound is brought to decompose under the action of an external source of energy (e.g. a laser beam), thus liberating metal atoms on the plastic surface;

the so-processed plastic piece is immersed in an autocatalytic bath containing metal ions. The latter are then driven to sediment onto the surface containing the metal atoms which had been liberated in the preceeding step, thus inducing its metallization.

Another process of the same "positive" type consists firstly, to roughen a plastic surface either mechanically or chemically and, secondly, to deposit (or sediment) onto that roughened surface a colloidal substance containing Palladium ions which then "decorate" selectively the roughened surface. Finally, the latter is further immersed in an autocatalytic bath which promotes the formation of a metal film onto the Palladium-coated surface.

For completeness, it is worth mentioning a series of so-called "negative" processes which consist in irradiating with a laser beam a plastic surface in order to avoid, in contrast, its metallization during its immersion in an autocatalytic bath. These negative processes may find applications whenever the surface to be metallized is much larger than the one to remain devoid of metal. Evidently, they operate on surfaces which tend to metallize naturally and without specific teatment, when immersed in an autocatalytic bath.

However, metal films which are produced on plastics via all above either "positive" or "negative" techniques are characterized by a too low adhesion to foster effective applications, as for instance in electronics. Further, such techniques consisting of too many steps are too heavy to be put in practice economically. Their poor resolution limit their utilization on small surfaces. Therefore, there is a need for improving existing techniques and forming a very adherent, high resolution metal film on any plastic surface.

The main objective of the present invention is to introduce a novel technique which is smart, very simple and efficient at producing a thick, high geometrical definition metal film which is highly adhering on plastics of particular composition.

The "positive" metallization process which is the object of the present invention, is described in the first and following claims. It consists firstly in incorporating to the plastic material, formed principally of any given polymer (e.g. a polyamid), and during its fabrication, a non-organic powder which is actually dispersed in the plastic material. That non-organic powder is formed of oxide grains (e.g. oxides of antimony, aluminum, iron, zinc or tin), notably in volumic or massic concentration exceeding 1% and of variable grain sizes, preferably smaller than 50 micrometers.

During the first step of the process which is described in this invention, the surface of the so-formed plastic material (or composite) is irradiated with the light beam emitted by a laser. Preferably, that light is emitted in the ultraviolet, during a very short duration (or pulse), repeated if necessary at regular time intervals. This pulsed emission is preferably of high energy (for instance, comprised between 0.05 and 0.2 J), i.e. containing a very large number of photons. It may also operate at a wavelength below or equal to 350 nanometers, corresponding approximately to a photon energy equal to or larger than 3.5 eV. As an example, such an emission may be obtained from an excimer laser source emitting during 20 nanoseconds, at a 248 nanometers wavelength corresponding to a photon energy of 5 eV.

Above a given energy density (or threshold energy density) which may be obtained by focalizing the laser beam on the irradiated surface (typically, 0.5 J/cm$^2$) and the value of which depends on the nature and concentration of the oxide grains in the composite, the action of this radiation is then two-fold:

a. on one hand, the base material itself (the polymer) undergoes a superficial ablation of some 0.2 micrometer per pulse;

b. on the other hand, and depending on the choice of the incorporated granular substance, the same radiation creates at the surface of the oxide grains which emerge then in larger numbers from the actual composite surface (cf. a.) a high concentration of polarized defects. The latter materialize as a consequence of breaking some of the interatomic bonds at the surface of the surface grains. They result from the combined actions of the electronic excitations which take place within these bonds following the absorption of the laser photons by the grains themselves. The actual concentration of such defects at the surface of the oxide grains is proportional to the laser energy density as resulting from the laser beam focalization at the surface of the composite.

In the second step of the process, and without any other intermediate processing, the so laser-treated composite is directly immersed in an autocatalytic bath containing metal ions (e.g. $Cu^+$ or $Ni^+$) and the chemical composition of which is known from the state of the art. The metal contained in the bath is then selectively driven to deposit on those sections of the plastic surface which have been previously irradiated by the laser beam and which contain the polarized defects produced by the same irradiation. The actual presence of these defects on the oxide grains makes useless, in the present invention, the usually practiced processing step which is inherent to a classical autocatalytic (i.e. "electroless") metal deposition, that is immersing the piece to be metallized into a bath containing Palladium ions prior immersing it into the properly speaking autocatalytic bath. The autocatalytic metallization procedure which is followed in the present invention does not use any substance containing Palladium to drive the (Cu or Ni) plastic surface metallization. In the present invention, the latter is directly induced by the superficial defects which are laser-created on the oxide grains present at the composite surface.

After an incubation time the duration of which decreases when increasing the laser energy density which is used in the first step of the present process, the thickness of the (Ni or Cu) metal deposit is then approximately proportional to the actual immersion duration, the latter being reduced by the incubation time, i.e. 20 or 5 micrometers per hour (after incubation ) in a Ni or Cu bath, respectively.

The interface between the composite and the metal film which is obtained via the process described in the present invention is de facto rough, as resulting from the partial ablation of the polymer surface. On the other hand, the interstitial coupling (i.e. via either covalent or ionic strong bonds) of the metal ions from the autocatalytic bath onto the superficial grain defects of that roughened surface is selective and strong. The direct consequence of these two characteristics is that the adhesion of the metal deposit onto the composite, as resulting from the process which is described in the present invention, is remarkably high and materializes as an efficient anchoring of the metal film onto the composite surface via the superficially metallized oxide grains which are present at the composite surface. The resulting metal adhesion attains then some 10 MPa. It may be further increased by letting the metal diffuse towards the inner part of the composite. This latter step can be performed by selectively heating the metal film during a short period of time for example in a microwave oven. During that period, the polymer and the other non-metallic components of the complex formed by the composite and the metal film are not affected by the waves emitted in the oven and, therefore do not heat. The latter selectively heat the metal which may then diffuse in part into the composite.

Another advantage of the process described in the invention relates to the fact that the definition of the metallized areas depends uniquely on the laser irradiation conditions. In effect, the modifications which are produced at the composite surface by the ultraviolet light beam are restricted to those areas which have been irradiated. The precise definition of the limits to those areas is further proportioned to the actual wavelength which is preferably chosen to be lesser than 350 nanometers.

A final advantage of the present process relates to the fact that, for every composite formulation, the surface sensitivity to the laser radiation depends on the incident laser energy density. During immersion of the laser processed surface into the autocatalytic bath, metallization is at first restricted to the actual surface of the oxide grains which emerge from the composite. Then, metallization proceeds at random from those grain sites and covers progressively the whole of the laser processed surface area of the composite. The incubation time measures the period of time which is necessary to form a continuous metal film on the composite surface. After that time, the metal deposit may develop perpendicularly to the surface in a most efficient manner (typically, 20 micrometers per hour for nickel). From thereon, the actual thickness of the metal film increases homogeneously all over the laser processed composite surface, whichever the composite formulation and the initial laser processing. For a given composite, it is possible to vary at will the laser energy density which is utilized for irradiation. The areas which are irradiated at high energy density have an incubation time, at time of immersion in the autocatalytic bath, which may attain some 10 minutes, whilst other areas which are irradiated at lower energy density may have an incubation time of the order of 50 minutes, for example. Therefore, the process which is described in this invention allows to produce at once, on the same composite surface, and during one single immersion in an autocatalytic bath, metal films with varied thicknesses.

All advantages of the process described in this invention result directly from the utilization of an intense and pulsed ultraviolet light beam, as for instance the one emitted by an excimer laser source working at a wavelength equal (or inferior) to 308 nanometers. All other light sources working in the visible or infra-red range, in pulsed or continuous regime, cannot produce structural or compositional (polarized) defects on the oxide grains which are incorporated into the polymeric base of the composite, all such defects which are necessary in the presently described process for the metallization of specifically formed composites.

Independently from all the above advantages of the present invention and which will be obvious from the following examples, the list of added species to the polymeric base which are necessary for the metallization of a composite is not limitative. It may be accrued without changing the spirit of the process which is the object of this invention.

EXAMPLE NO. 1

A plate of composite material containing respectively i) 92% of polyamid-6 (PA-6) and ii) 8% of white-colored $Sb_2O_3$ powder by volume is irradiated with one single pulsation of light emitted by an excimer laser source working at 248 nanometers and delivering an energy density of 0.5 $J/cm^2$ during 20 nanoseconds on the material surface. As a result of the light absorption by the material, the color of the irradiated surface turns from white to dark brown. The same plate is then immersed into an autocatalytic bath maintained at 38° C., with a pH comprised between 8 and 11, and containing copper ions in given proportion. Following from this proportion, the previously irradiated (and so-colored) surface of the plastic material is progressively covered with a copper film the thickness of which is 5 micrometers after a one-hour immersion. Adhesion of the metal film is then evaluated via a standard pull-test technique which yields a 10 MPa pull-strength for separating the film from the plastic surface.

EXAMPLE NO. 2

A plastic piece, made of PA-6 and containing a flame extinguisher, the formulation of which comprises 4% volumic proportion of $Sb_2O_3$ powder as compared to the overall volume of the piece, is irradiated with three pulses of the light emitted by the source utilized in Example No. 1. The piece is subsequently immersed for one hour in the same autocatalytic bath as in Example No. 1. At the end of immersion, the thickness of the deposited metal film on the irradiated surface is equal to 4 micrometers.

EXAMPLE NO. 3

A plastic piece, identical to the one described in Example No. 2, is displaced at a constant (3 cm/sec) velocity in a plan perpendicular to the axis of an excimer laser beam while the latter emits light pulses at a 10 Hz repetition rate. The laser beam section is homogenized over a 3×3 mm area before reaching the piece surface. Irradiation and displacement of the piece are interrupted after 5 seconds. The piece is subsequently immersed in the same bath as in the other examples for 30 minutes. A 2 micrometer thick metal film is so obtained over a 3 mm wide, 150 mm long track.

EXAMPLE NO. 4

A plastic piece containing 88% of PA-6 and 12% of $Sb_2O_3$ powder by volume is irradiated with a pulsed laser beam working at 248 nanometers and focused over a circular, 0.4 mm diameter surface, with an 0.5 $J/cm^2$ energy density. The piece is mounted on a substrate which can be computer-displaced in a plane perpendicular to the beam axis along two orthogonal directions. The piece is then displaced in that plane in such a way that the beam impact on the piece surface traces a circular, 2 cm diameter track. The piece is subsequently immersed for one hour in the same bath as for the other examples. At the end of immersion, a circular 2 cm diameter copper track is obtained on the piece surface. The track thickness and width are 5 micrometers and 0.4 mm, respectively.

EXAMPLE NO. 5

A plastic piece identical to the one utilized in Example No. 1 is irradiated for 20 nanoseconds over a 5×5 mm area with an excimer laser beam working at 248 nanometers and 0.5 $J/cm^2$. Another 5×5 mm of the same piece is then irradiated with the same laser source with an energy density of 0.2 $J/cm^2$. The piece is subsequently immersed for one hour in an autocatalytic bath containing nickel ions and maintained at 90° C. A metal film develops on each irradiated surface. The actual metal thicknesses are then measured after immersion to be 16 and 3 micrometers on the surfaces irradiated at 0.5 and 0.2 $J/cm^2$, respectively.

EXAMPLE NO. 6

The piece which has been used in Example No. 1 is again metallized as in Example No. 1. It is subsequently introduced for 5 seconds in a 1 500 W microwave oven. Adhesion of the 5 micrometer-thick copper film is then evaluated by the pull-test yielding a pull force of 35 MPa for separating the copper film from the plastic piece.

It is obvious that the invention is not limited to the above examples and that a number of modifications may be introduced to such examples without departing from the present invention. For example, it is possible to use an electrolytic (polarized)immersion bath instead of the autocatalytic (unpolarized) bath.

I claim:

1. A positive metallization process for metallizing a plastic composite piece containing a polymer plastic material and oxide grains, said oxide grains being made of one or more oxides, comprising three successive steps, the first step consisting of the irradiation of a surface area of a plastic piece to be metallized with a light beam emitted by an excimer laser, said plastic piece being made from a polymer plastic material and oxide grains, said oxide grains being made from one or more oxides, the second step consisting of immersing said irradiated plastic piece in at least one autocatalytic bath containing metal ions and without palladium, said immersion inducing the deposit of said metal ions onto said irradiated surface area to form a metal film on said surface area resulting in the selective metallization of said surface area of said plastic piece, and the third step consisting of thermally processing said metallized plastic piece to induce diffusion of said deposited metal film into said polymer plastic material of said plastic piece.

2. The process as claimed in claim 1, wherein said excimer laser emits said light beam at a wavelength between 170 and 350 nanometers and the energy density of said light beam is selected to produce a high concentration of structural defects at a surface of said oxide grains present at said irradiated surface area of said irradiated plastic piece, said structural defects at the surface of said oxide grains allowing the metallization of said surface area of said plastic piece during immersion into said autocatalytic bath.

3. The process as claimed in claim 1, wherein said light beam emitted by said excimer laser is homogenized by passing said light beam through a homogenizing optical system which is able to homogenize the intensity of said light beam.

4. The process as claimed in claim 3, wherein said homogenized light beam passes through at least one of a square, rectangular and circular planar mask, said planar mask being disposed in a plane perpendicular to the axis of said light beam and said planar mask being interposed between said excimer laser and said plastic piece.

5. The process as claimed in claim 4, wherein said plastic piece is disposed either in contact with said planar mask or at a distance not exceeding 0.5 mm from said planar mask during the step of irradiation.

6. The process as claimed in claim 1, wherein said light beam emitted by said excimer laser is focused by a focusing optical system, said focused light beam having a diameter equal to or larger than 10 micrometers at said surface area of said plastic piece.

7. The process as claimed in claim 1, wherein said oxide grains include oxide grains of $Sb_2O_3$, $SnO_2$, $Al_2O_3$, ZnO, $Fe_2O_3$, $Fe_3O_4$ or mixtures thereof.

8. The process as claimed in claim 1, wherein the diameter of said oxide grains is between 0.5 and 50 micrometers.

9. The process as claimed in claim 1, wherein the volumic or massic proportion of said oxide grains contained in said plastic piece is between 1 and 30% of the overall volume or mass, respectively, of said plastic piece.

10. The process as claimed in claim 1, wherein said third step of thermally processing is performed by placing said metallized plastic piece inside a microwave oven and selectively heating said metal film and inducing metal atoms of said metal film to diffuse into said plastic piece.

11. The process as claimed in claim 1, further comprising the additional step of repeating said second step on said metallized plastic piece, said repeated second step including immersing said metallized plastic piece in an autocatalytic bath containing different metal ions from said second step, and wherein two or more metal films containing different metal atoms are separately deposited onto one or more surface areas of said plastic piece, and said two or more metal films at least partially overlap on said surface areas.

12. The process as claimed in claim 1, wherein a plurality of said plastic pieces are irradiated using an automatized procedure and said plastic pieces are individually brought in front of said light beam by a continuously moving carrier.

13. The process as claimed in claim 12, wherein said irradiated pieces carried by said moving carrier are thereafter driven to said autocatalytic bath and said irradiated pieces are immersed by said moving carder into said autocatalytic bath.

14. The process as claimed in claim 1, wherein said thermal processing is performed by a microwave oven, and the thickness of said metal film on said surface area of said plastic pieces after laser irradiation and immersion into said autocatalytic bath and thermally processing in said microwave oven, is determined by the energy density of said excimer laser light beam on said irradiated surface area and by the duration of immersion into said autocatalytic bath.

15. The process as claimed in claim 1, further comprising the step of immersing said metallized plastic piece into a second autocatalytic bath containing another metal, for forming a metallized plastic piece which is metallized with two overlapping and different metal films.

16. A positive metallization process for metallizing a plastic composite piece containing a polymer plastic material and oxide grains, said oxide grains being made of one or more oxides, comprising the steps of:

i) irradiating a first surface area of a plastic piece to be metallized with a first light beam having a first energy density, said first light beam emitted by an excimer laser, said plastic piece being made from a polymer plastic material and oxide grains, said oxide grains being made from one or more oxides, immersing said irradiated plastic piece in a first autocatalytic bath containing metal ions and without palladium, said immersion inducing the deposit of said metal ions onto said irradiated first surface area to form a first metal film on said first surface area resulting in the selective metallization of said first surface area of said plastic piece;

ii) irradiating a second surface area of said plastic piece with a second light beam, said second surface area being different from said first surface area, said second light beam having an energy density which is different from said first energy density, said second light beam emitted by an excimer laser, immersing said twice irradiated plastic piece in an autocatalytic bath containing the same or different metal ions than said first autocatalytic bath and without palladium, said immersion inducing the deposit of said metal ions onto said irradiated second surface area to form a second metal film on said second surface area resulting in the selective metallization of said second surface area of said plastic piece;

iii) thermally processing said metallized plastic piece to induce diffusion of said first and second deposited metal films into said polymer material of said plastic piece by placing said plastic piece into a microwave oven.

* * * * *